United States Patent [19]

Lagowski

[11] Patent Number: 5,025,145

[45] Date of Patent: Jun. 18, 1991

[54] METHOD AND APPARATUS FOR DETERMINING THE MINORITY CARRIER DIFFUSION LENGTH FROM LINEAR CONSTANT PHOTON FLUX PHOTOVOLTAGE MEASUREMENTS

[76] Inventor: Jacek J. Lagowski, 7 Rag Rock Dr., Woburn, Mass. 01801

[21] Appl. No.: 235,305

[22] Filed: Aug. 23, 1988

[51] Int. Cl.$^5$ .............................................. H01J 40/14
[52] U.S. Cl. ............................ 250/211 J; 324/158 D
[58] Field of Search ........... 324/158 R, 158 D, 158 T; 250/211 R, 211 J, 215

[56] References Cited

U.S. PATENT DOCUMENTS

| | | | |
|---|---|---|---|
| 4,333,051 | 6/1982 | Goodman | 324/158 R |
| 4,393,348 | 7/1983 | Goldstein et al. | 324/158 D |
| 4,567,431 | 1/1986 | Goodman | 324/158 R |
| 4,581,578 | 4/1986 | Honma et al. | 324/158 D |
| 4,598,249 | 7/1986 | Goodman et al. | 324/158 R |
| 4,656,419 | 4/1987 | Garlick | 324/158 D |

OTHER PUBLICATIONS

Goodman, "A Method for the Measurement of Short Minority Carrier Diffusion Lengths in Semiconductors", *J. Appl. Physics*, vol. 33, No. 13, Dec., 1961, p. 2250.
Goodman, "Minority Carrier Diffusion Length in Silicon by Measurement of Steady-State Surface Photovoltage", *ASTM Standard*, F-139, 1978.
Dmitruk et al., "Investigation of Surface Recombination on Epitaxial GaAs Films", *Phys. Stat. Sol.* (a) 20, 53, 1973.
Luke and Cheng, "A Chemical/Microwave Technique for the Measurement of Bulk Minority Carrier Lifetime in Silicon Wafers", *J. Electrochem. So.*, Apr. 1988, p. 957.
Moss, "Photovoltaic and Photoconductive Theory Applied to InSb", *Journal of Electronics and Control*, 1, 126 (1955).
Phillips, "Interpretation of Steady-State Surface Photovoltage Measurements in Epitaxial Semiconductor Layers", *Solid State Electronics*, vol. 15, 1972, p. 1097.
Choo and Sanderson, "Bulk Trapping Effect on Corner Diffusion Length as Determined by the Surface Photovoltage Method: Theory", *Solid State Electronics Perogamon Press*, 1970, vol. 13, p. 609.
Goodman, "Silicon Wafer Process Evaluation Using Minority Carrier Diffusion Length Measurement by the SPV Method", *RCA Review*, vol. 44, June 1983, p. 326.
Verkuil, "A Simple, Low Cost, Non-Contact Method of Measuring Bulk Minority Carrier Diffusion Lengths", *The Electrochemical Society*, Extended Abstracts from Spring Meeting, May 1980, Abstract No. 193.
Saritas et al., "Diffusion Length Studies in Silicon by the Surface Photovoltage Method", *Solid State Electronics*, vol. 31, No. 5, pp. 835-842, 1988.
Chu and Stokes, "A Composition of Corner Lifetime Measurements by Photo-Conductive Decay and Surface Photovoltage Methods", *J. Appl. Phys.*, vol. 49, May 1978, p. 2996.
Saritas et al., "Comparison of Minority-Carrier Diffusion Length Measurements in Silicon by the Photoconductive Decay and Surface Photovoltage Methods", *J. App. Physics*, vol. 63, No. 9, May 1988.

Primary Examiner—David C. Nelms
Attorney, Agent, or Firm—Fish & Richardson

[57] ABSTRACT

This invention relates to the measurement of the minority carrier diffusion length of a semiconductor sample to evaluate the contaminant impurities which reduce the carrier lifetime.

24 Claims, 7 Drawing Sheets

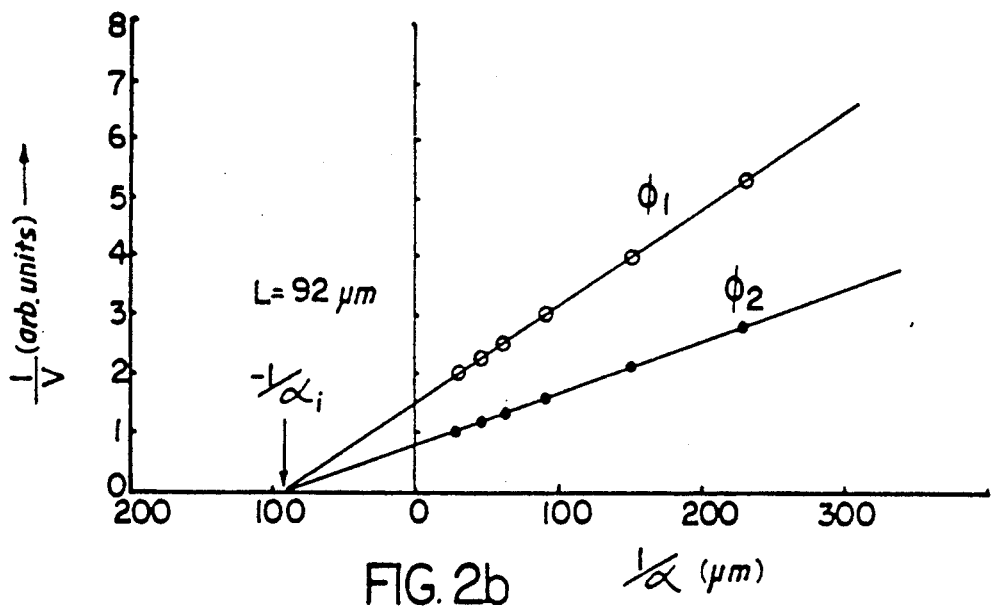
FIG. 2b
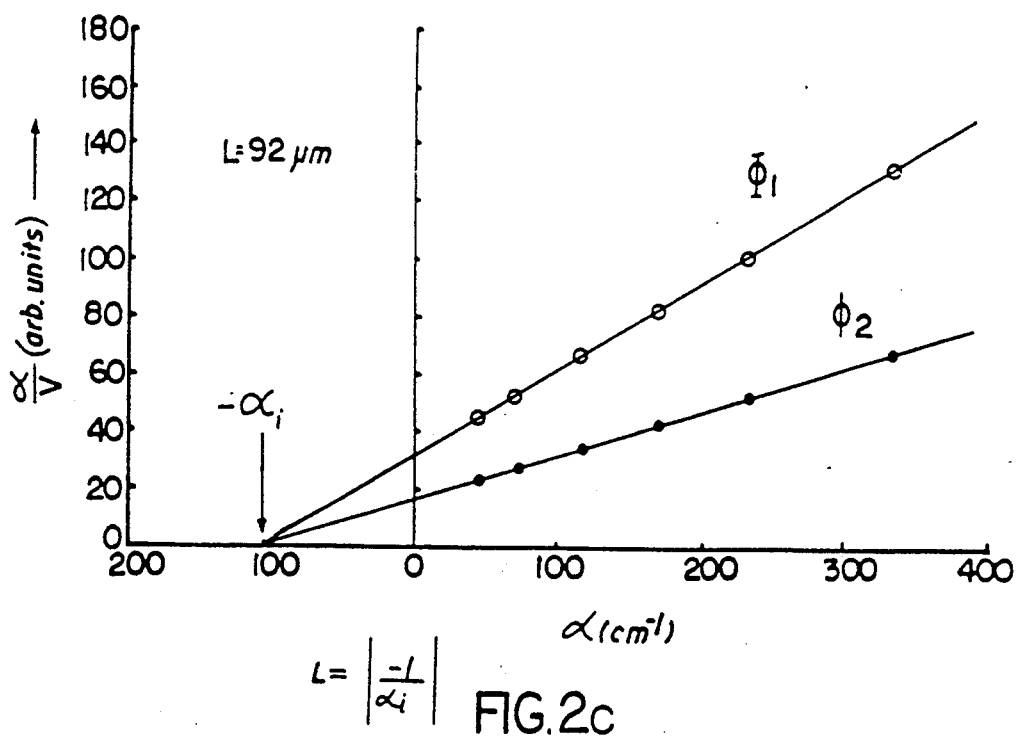
$L = \left|\frac{-1}{\alpha_i}\right|$  FIG. 2c

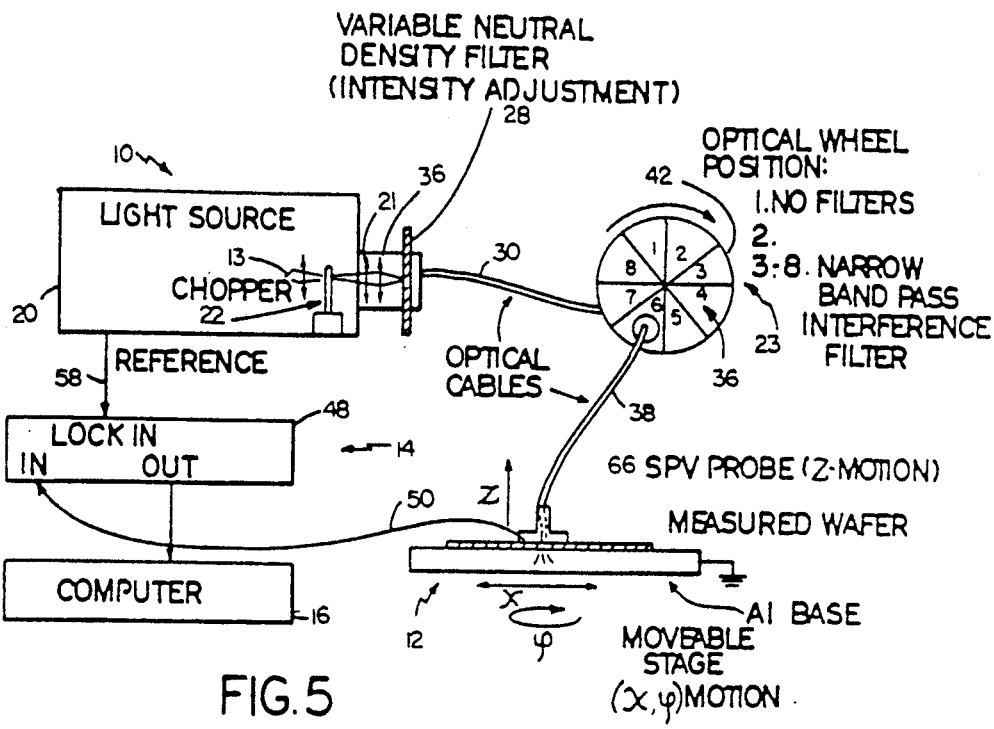
FIG. 5
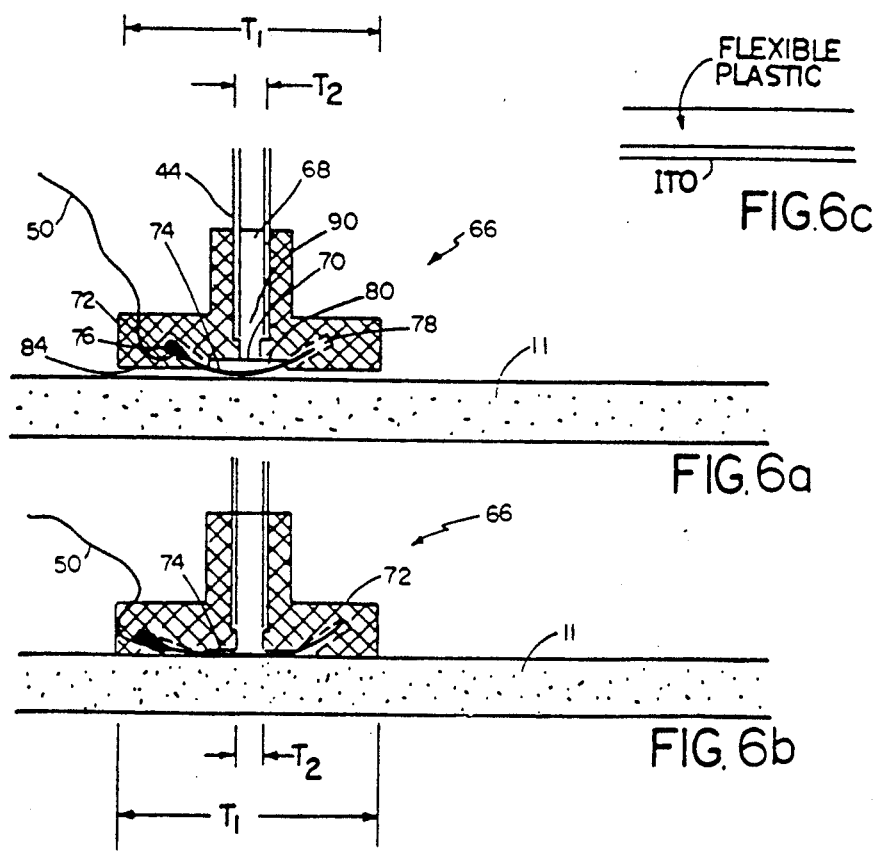
FIG. 6c
FIG. 6a
FIG. 6b

METHOD AND APPARATUS FOR DETERMINING THE MINORITY CARRIER DIFFUSION LENGTH FROM LINEAR CONSTANT PHOTON FLUX PHOTOVOLTAGE MEASUREMENTS

INTRODUCTION

Semiconductor materials and especially Silicon (Si), and Gallium Arsenide (GaAs) have become essential to the electronics industry for the production of electronic and optoelectronic devices and corresponding integrated circuits (IC's). To assure the high manufacturing yield and the device reliability, however, it is a requirement that the production of semiconductor wafers and their processing during IC manufacturing be carried out under conditions meant to minimize the introduction of heavy metal contaminants which are known to degrade the semiconductor devices by introducing lifetime killing recombination centers. It is necessary, therefore, for a quality control meansure of contaminant impurity both before processing, to establish that wafers are acceptably pure, and after processing to ensure that undue, debilitating contamination has not occurred. Since many measurements may be necessary both due to the need for measurement at various positions on a single wafer and the analysis of wafers after different processing steps and further, that the results of these analyses are indicative of the reliability of semiconductor devices formed or to be formed, the testing method must be both rapid and accurate.

One of the most common methods for determination of contamination measures a property of the semiconductor known as the minority carrier diffusion length (L) which indicates the effective distance that excess carriers diffuse through a semiconductor during their lifetime. Excess carriers in a semiconductor tend to redistribute due to a diffusion phenomenon which equalizes the carrier concentration. This diffusion process is controlled by the mobility of the excess minority carriers ($\mu$) and their lifetime ($\tau$). The diffusion length (L) is a parameter combining these two factors, and in the simplest case has the form:

$$L = \sqrt{\frac{kT}{q} \mu \tau} \quad (1)$$

here k the is Boltzman's constant, T is the temperature and q is the elementary charge Heavy metal contaminants in silicon wafers act as recombination centers which reduce the minority carrier lifetime $\tau$. By measuring the diffusion length, the concentration of the contaminants may then be determined.

A common, nondestructive technique for measuring L takes advantage of the process by which light impinging upon a semiconductor surface may be absorbed and produce excess carriers (holes and electrons) if the energy of the incident photons, $h\nu$ is above the semiconductor band gap $E_g$. As a result of the photogeneration and diffusion process, a certain number of electron-hole pairs reach the proximity of the surface and become separated by the electric field of the surface-space charge region to produce a surface photovoltage (SPV) Measurement of the photovoltage can thus be used for the determination of the minority carrier diffusion length L, and in turn for the determination of the lifetime $\tau$, and the concentration, $N_c$, of the heavy metal contaminants where $N_c \simeq C\tau^{-1}$ (and C is the constant depending on the individual impurity).

Prior methods for determining the diffusion length from the surface photovoltage rely on a procedure known as the "constant magnitude surface photovoltage," (CMSPV) method, the principles of which were proposed by Goodman in "A Method for the Measurement of Short Minority Carrier Diffusion Lengths in Semiconductors," *J. Appl. Phys.* Vol. 33, p.2750, 1961; subsequently adopted as the ASTM standard ANSI/ASTM F-391-78, p. 770, 1976 and discussed in U.S. Pat. No. 4,337,051.

The characteristic steps of this prior art approach are to measure the photovoltage and the photon flux at several wavelengths ($\lambda_i$) (corresponding to photon energies ($h\nu_i$)), vary the magnitude of the photovoltage by adjustment of the incident light intensity or photon flux ($\phi$) to produce a constant photovoltage, measure the corresponding photon fluxes, and then plot the photon flux values versus the reciprocal absorption coefficient $\alpha^{-1}$ of the semiconductor sample at the various photon energies. This plot is then linearly extrapolated to determine the intercept along the reciprocal absorption coefficient axis to obtain the minority carrier diffusion length L (i.e., $L = -\alpha^{-1}$ where $I=0$). Thus, in the CMSPV method the diffusion length is in fact determined not from the SPV values ($V_1 \ldots V_i$) measured for different incident photon energies ($h\nu_1 \ldots h\nu_i$) but from the corresponding values of the photon fluxes ($\phi_1 \ldots \phi_i$) required to maintain the constant magnitude SPV signal $V_1 = V_2 = V_3 \ldots V_i$ for all photon energies measured.

From a theoretical viewpoint, this prior art procedure overcomes the lack of an explicit formula relating the photovoltage with the absorption coefficient, and the diffusion length by taking advantage of the steady state relationship between the excess minority carrier density (i.e. electron density, $\Delta n_s$, for a P-type semiconductor or hole density, $\Delta p_s$, for N-type semiconductor) at the proximity of the illuminated surface of a sufficiently thick ($d \gg \alpha^{-1}$) semiconductor wafer. This relationship is in fact readily available from theoretical treatment, described by [reference] namely, $$\Delta n_s = \frac{\Phi(1-R)}{D/L + S} \cdot \frac{1}{1 + \alpha^{-1}L^{-1}} \quad (2)$$

where R is the reflectivity, D is the minority carrier diffusivity and S is the surface recombination velocity. The excess carrier density, $\Delta n_s$ is dependent upon the photon energy, $h\nu$, of the impinging light due to the strong dependence of the absorption coefficient, $\alpha$ on photon energy for the case where the photon energy is greater than or equal to the band gap, $h\nu \gtrsim E_g$.

The prior art method then assumes that a surface photovoltage, V, is a monotonically increasing function of the excess carrier density, $\Delta n_s$, i.e., $V = f(\Delta n_s)$, and concludes that the constant surface photovoltage $V = $const, corresponds to carrier density being constant, $\Delta n_s = $const, or that:

$$V = const \rightarrow \Delta n_s = const, \quad (3)$$

Employing relationship (2), condition (3) is shown to yield:

$$\Phi(V = const) \simeq C_1 (1 + \alpha^{-1}L^{-1}) \quad (4)$$

where $C_1$ is a constant parameter practically independent of absorption coefficient $\alpha$, and it is this expression that is then used for determining the value of diffusion length L in the CMSPV method.

Unfortunately, however, the CMSPV method is prone to error in the assumption that the photovoltage is always a monotonically increasing function of $\Delta n_s$. Cases have been reported whereby surface photovoltage decreased with increasing carrier density, $\Delta n_s$, due to various surface effects. Furthermore, the parameters S, D and L in expression (2) which relates carrier density $\Delta n_s$ and absorption coefficient $\alpha^{-1}$ can become themselves functions of the photon flux at higher fluxes, thereby pertubing the theoretical steady state expression. Both of these phenomena invalidate the CMSPV assumption and lead potentially to measurement error.

Furthermore, the CMSPV technique is a multistep procedure which includes finding constant voltage and corresponding photon flux for each measurement at each photon energy, thereby requiring considerable time even when a servo-mechanism is employed to control the photon flux in response to the measured photovoltage or considerable effort of the operator in the manual measurement mode. Finally, the prior art method for measuring SPV requires the inconvenience of making photovoltage measurements while shielding the measuring stage to avoid errors in the determined diffusion length value and noise effects introduced to the measurements by ambient light.

It is, therefore, the object of the present invention, to provide a method and apparatus for a more accurate, reliable, simpler and faster determination of the minority carrier diffusion length.

DESCRIPTION OF THE PREFERRED EMBODIMENT

BRIEF DESCRIPTION OF THE FIGURES

FIG. 2b is a plot of the reciprocal of surface photovoltage versus the reciprocal absorption coefficient according to the invention for two different values of the photon flux ($\phi_2 = 2\phi_1$).

FIG. 2c is a plot of the absorption coefficient divided by photovoltage as a function of the absorption coefficient according to the invention. The photon flux $\Phi_2 = 2\Phi_1$.

FIG. 5 is a block schematic of a diffusion length measuring system.

FIG. 6a is a detailed cutaway view of the measurement probe in a position just above a sample surface.

FIG. 6b is a detailed cutaway view of the measured probe positioned at a sample surface as it would be during a photovoltage measurement.

FIG. 6c is a detailed expanded view of a flexible electrode.

GENERAL DESCRIPTION

In the present invention, an induced photovoltage is first measured for different photon fluxes to assure linearity of photovoltage versus photon flux. Next, using light with constant photon flux of the value within the linear photovoltage range, the photovoltage is measured for a series of selected photon energies and those photovoltage values which monotonically increase with the photon energy are plotted as a function of the reciprocal absorption coefficient corresponding to the given photon energies. The minority carrier diffusion length is determined by extrapolating to find the reciprocal absorption coefficient at zero photovoltage. The values outside of the monotonical range are rejected from the analysis, which eliminates interference from the surface effects and assures an accurate determination of the diffusion length. This method therefore determines diffusion length directly from the surface photovoltage measured in the different incident photon energies.

The linear photovoltage constant photon flux approach of the present invention is an improvement over constant magnitude surface photovoltage procedures in that it eliminates measurements of the photon flux and the need for equalizing the magnitude of the SPV signal and is therefore much faster and simpler and thus more suitable for measurements on many wafers or for several measurements at different positions on each wafer as is required for a meaningful determination of the contamination on semiconductor integrated circuits processing lines. Furthermore, it reduces or eliminates the danger of inaccuracies and errors encountered due to surfaces or light intensity effects in diffusion length measurements.

DETAILED DESCRIPTION

Figure 1A:
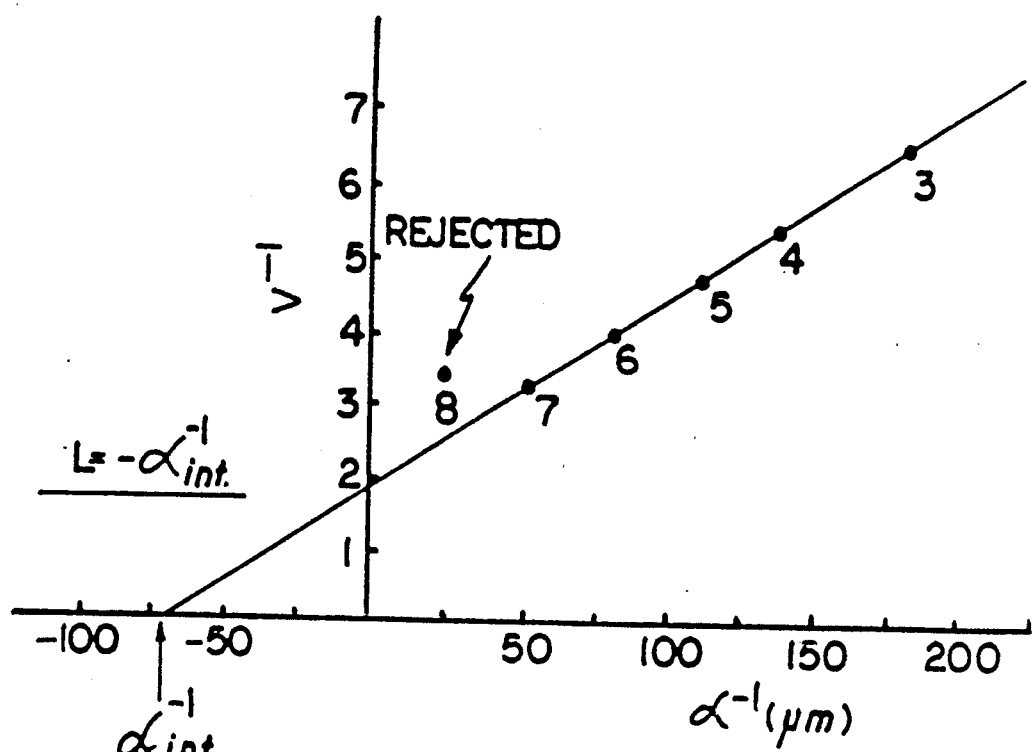
FIG. 1a is a plot of the reciprocal of the linear constant photon flux surface photovoltage as a function of the reciprocal absorption coefficient according to the invention.

Referring to FIG. 1a, a plot of the reciprocal photovoltage as a function of the reciprocal absorption coefficient (corresponding to a series of photon energy or wavelengths) is given by which the minority carrier diffusion length L may be determined by extrapolation. Point eight which does not satisfy the monotonically increasing criterion (where, for example, $V_n < V_{n+1}$ see also FIG. 1d) is rejected from the computation of the diffusion length L.

The prior art methods, such as the CMSPV method, allow for the possibility of error from two sources. First the intensity of impinging light for the selected photovoltage may be outside of a linear surface photovoltage range. Secondly, photovoltage may not be a monotonically increasing function of photon energy due to surface effects.

Figure 1B:
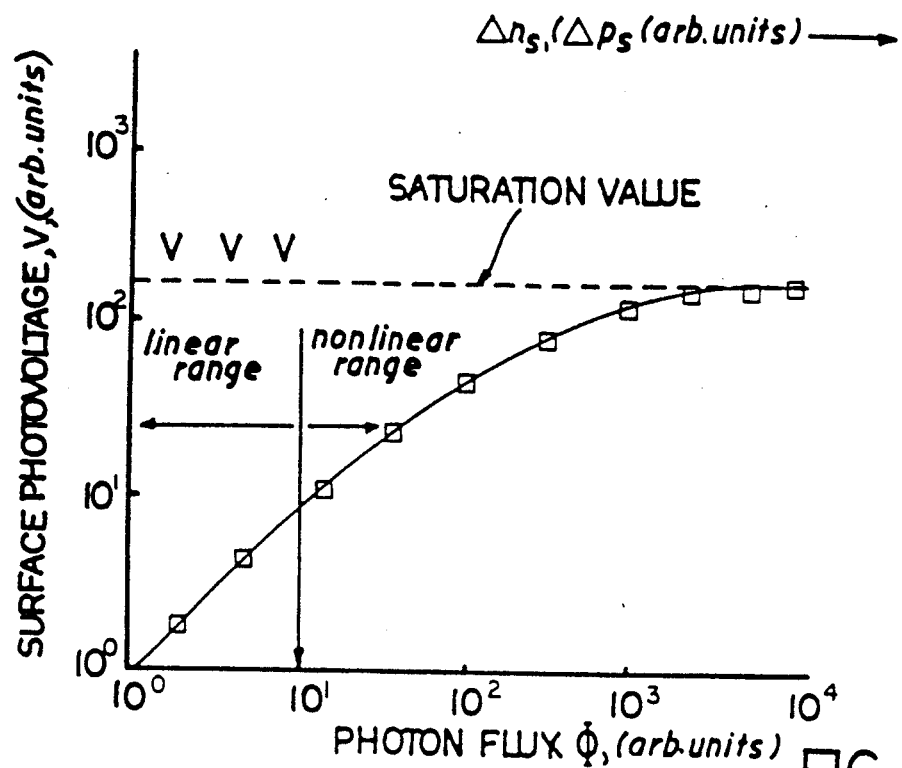
FIG. 1b is a plot of the surface photovoltage as a function of photon flux and the excess carrier density for constant photon energy.

The validity range of the expression (2) and corresponding expression (4) must be in fact limited to low excitation densities and thus low values of photon flux $\phi$. For higher excitation densities the parameters S, L and D become dependent on the photon flux $\phi$. Furthermore, the diffusion process can change from unipolar to the ambipolar diffusion, changing the meaning and values of the diffusion length, L. For high photon flux the value of the photovoltage also tends to saturate, approaching a value, $V_s$, equal to a sum of the dark value of the surface potential barrier, $V_o$, and the Dember potential, $V_d$. This behavior is shown in FIG. 1b as the curve of surface photovoltage versus photon flux tends to approach the saturation value $V_s$ at higher fluxes. We realize that the values of the diffusion length L determined by surface photovoltage methods depend on the illumination intensity and furthermore, for the CMSPV method depend on the selected value of the surface photovoltage. In order to eliminate the interfering effects it is necessary to perform surface photovoltage measurements at sufficiently low illumination intensity and to carry out tests proving that illumination does not affect the measurement parameters Furthermore, the assumption that for constant photovoltage, the excess carrier density $\Delta n_s$ is also constant, expression (3), which is fundamental for the accuracy of the constant magnitude photovoltage methods, is not always valid since the same values of the photovoltage may correspond to different values of the carrier density $\Delta n_s$ as will now be shown.

Figure 1C:
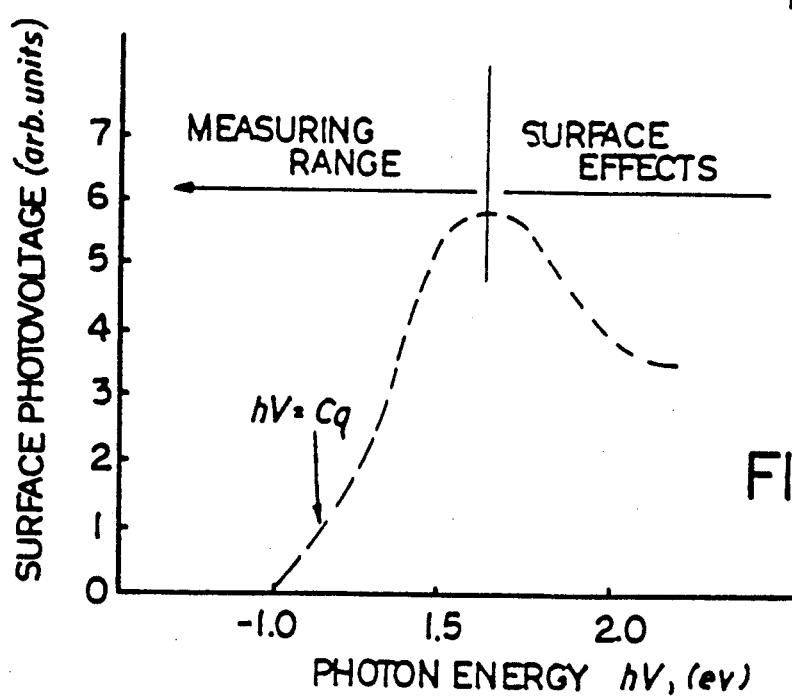
FIG. 1c is a plot of the constant photon flux surface photovoltage as a function of the photon energy showing a monotonical and a nonmonotonical range which is caused by surface effects.

Referring to FIG. b, the photovoltage always increases monotonically with the excess carrier density $\Delta n_s$ (changed by changing the photon flux, $\phi$) providing that the photon energy is kept constant. However, as is the case in any surface photovoltage diffusion length measurements, when different photon energies are employed the SPV signal may pass through the maximum as shown in FIG. 1c. In this condition, the relation between surface photovoltage and carrier density $\Delta n_s$ is no longer a unique one but rather the same photovoltage may correspond to different values of carrier density. Several phenomena could lead to such a photovoltage maximum such as the Dember effect, surface defects or the contribution from residual photovoltaic effects on the back surfaces or the internal junctions present in a semiconductor sample.

It is thus apparent that the assumption that photovoltage is a monotonic function of the carrier density, $\Delta n_s$ does not guarantee the validity of constant photovoltage methods such as the CMSPV approach. This condition must be supplemented by the additional requirement that photovoltage is also a monotonically increasing function of the photon energy, $h\nu$. For a reliable determination of diffusion length L, this latter condition must be verified experimentally and used to select the measurement range of photon energy.

The present procedure for determining the diffusion length recognizes all these interfering phenomena and eliminates their contribution by confining the illumination to the low intensity range corresponding to the linear photovoltage range and by limiting the spectral range to regions whereby the photovoltage increases monotonically with the photon energy. Under these conditions a direct relation between surface photovoltage and absorption coefficient may be found as will now be expressed.

The linear SPV condition, simply, $$V = A\phi \tag{5}$$

where A is a constant and V is the photovoltage, combined with a monotonical relationship between photovoltage and photon energy (and thus photovoltage and absorption coefficient $\alpha$) eliminates the need for the photon flux measurements to produce a constant photovoltage. In the low intensity range a direct relationship exists between the surface photovoltage and the excess carrier density that is, $$V = A_2 \Delta n_s \tag{6}$$

Expressions 5, 6 and 2 then lead to the explicit expression for surface photovoltage as a function of diffusion length L, namely $$V = \text{const } \phi_{eff} \frac{\alpha}{1 + \alpha L} \tag{7}$$

(where $\phi_{eff} = \phi(1 - R)$ is the effective photon flux). Equation (7) is used in the present invention for determination of diffusion length directly from the constant photon flux, $\phi_{eff}$=const, photovoltage measurement.

Figure 2A:
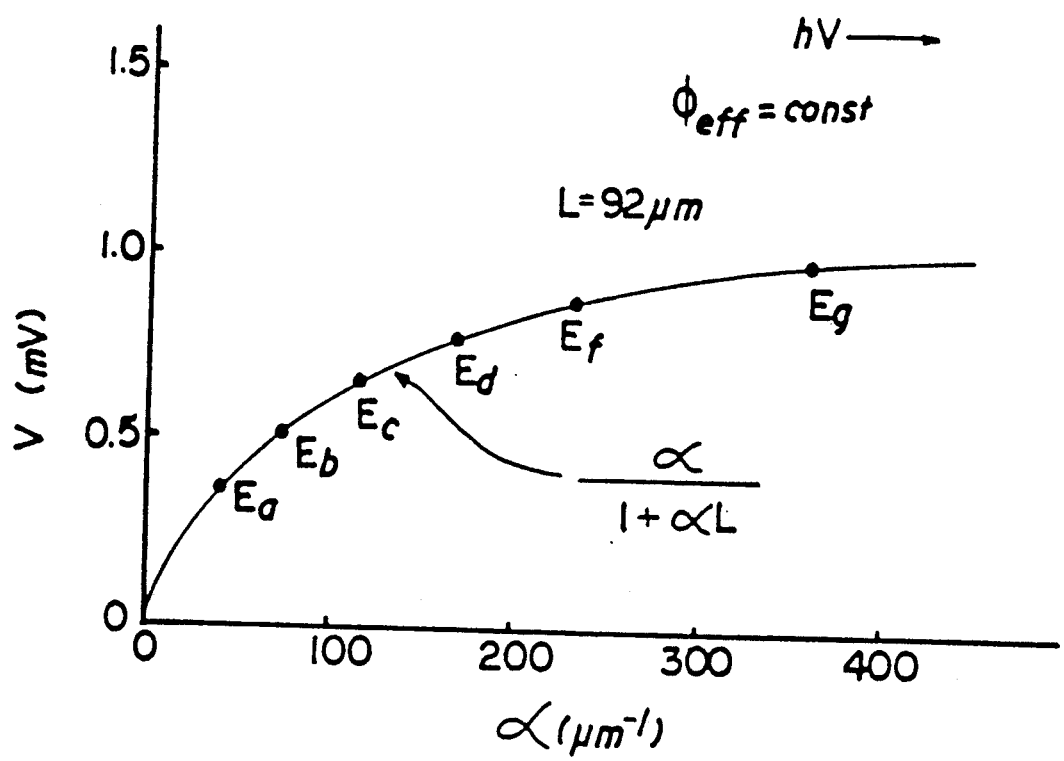
FIG. 2a is a plot of surface photovoltage versus absorption coefficient according to the invention.

In FIG. 2a, the validity of expression (7) is demonstrated. The photovoltage values for an N-type FZ-silicon wafer of known diffusion length, L=92 $\mu$m, induced by incident light of photon energies $h\nu > E_g$, (where the effective photon flux at each energy has the same value low enough to ensure that photovoltage versus $\phi$ is in the linear range) are plotted versus absorption coefficient. As is evident from the figure, the experimental values fall properly on the ideal line calculated using expression (7).

Referring to FIG. 2b and 2c, two methods for calculating the minority carrier diffusion length L employing relation (7) are demonstrated by plots in which the photovoltage is observed at constant photon flux for two values of the photon flux such that photovoltage is a linear function of the flux.

In FIG. 2b, the reciprocal of the induced photovoltage, plotted versus the reciprocal of the absorption coefficient yields the diffusion length L by extrapolation to the absorption coefficient axis as described herein with respect to FIG. 1a. This plot represents the rearrangement of expression (7) where $$V^{-1}|_{\phi_{eff}=const} = CONST \times (1 + \alpha^{-1}L^{-1}) \tag{8}$$

In FIG. 2c, a plot of absorption coefficient divided by photovoltage, $\alpha/V$ versus absorption coefficient $\alpha$ is shown where the diffusion length L is again found by extrapolation as shown which represents the rearrangement of expression (7) where $$\frac{\alpha}{V}\bigg|_{\phi_{eff}=const} = CONST \times (1 + \alpha L) \tag{9}$$

As can be seen both methods of course, provide the correct value of L, 92 $\mu$m. Furthermore, they yield the same L=92 $\mu$m for two different values of photon fluxes $\phi_1$ and $\phi_2$. The method of FIG. 2c provides the convenient advantage over the method of FIG. 2b in that the points of the plot are spread across a greater range of X axis values.

Another aspect of the invention, arising as a consequence of expression (7), allows for verifying, first, that the photon flux selected for measurement is indeed such that the photovoltage is a linear function of flux and, secondly, that the proper values of the absorption coefficient, used in the method for calculating diffusion length L, have been selected. This later concern arises from the fact that several values for an absorption coefficient for a given semiconductor and photon energy may be available in the literature. Selection of an inaccurate value necessarily results in errors in the calculation of the diffusion length, L as discussed in Saritas et al. "Comparison of minority-carrier diffusion length measurements in silicon by the photoconductive decay and surface photovoltage methods", *J Appl. Phys* 63(9), 1988.

Figure 3:
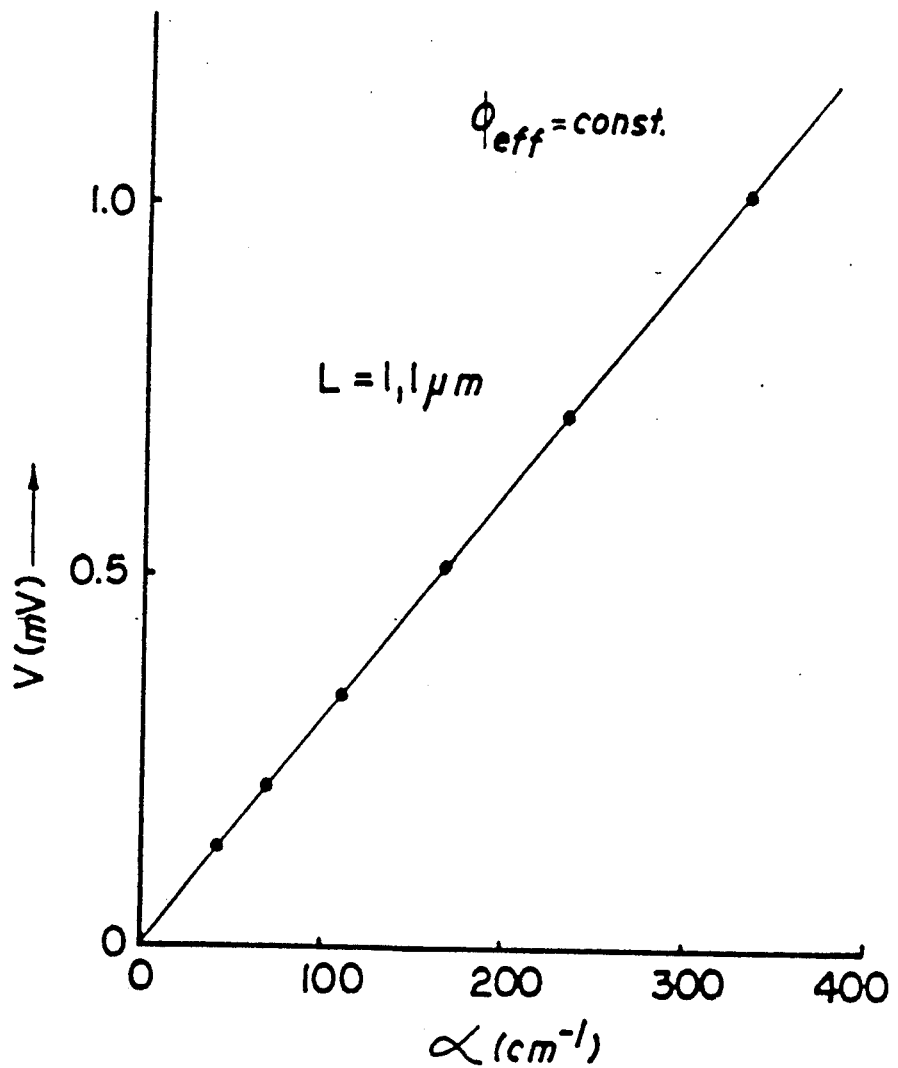
FIG. 3 is a plot of photovoltage versus absorption coefficient for a semiconductor sample of known, very short diffusion length according to the invention.

From relation (7) it is apparent that for small values of the diffusion length L or, $\alpha L << 1$, the photovoltage is a linear function of the absorption coefficient. A plot of photovoltage versus absorption coefficient for such a case for an N-type FZ-silicon sample with a short diffusion length (due to contamination) $L=1.1$ μm, is shown in FIG. 3. As can be seen all points fall on the linear plot indicating that the photon flux is indeed constant and its value has been properly selected such that photovoltage is a linear function of flux and that the correct values of the absorption coefficients, $\alpha$, have been used. If measured points were to fall off the line, errors in the calculation of the diffusion length L due to improper selection of the photon flux or the absorption coefficients might arise. Thus, a method is provided to check the selected value of the photon flux and absorption coefficients by measuring the photovoltage versus absorption coefficient for a semiconductor sample of known, short diffusion length prior to (or after) measurements are made on an unknown semiconductor sample.

Figure 4:
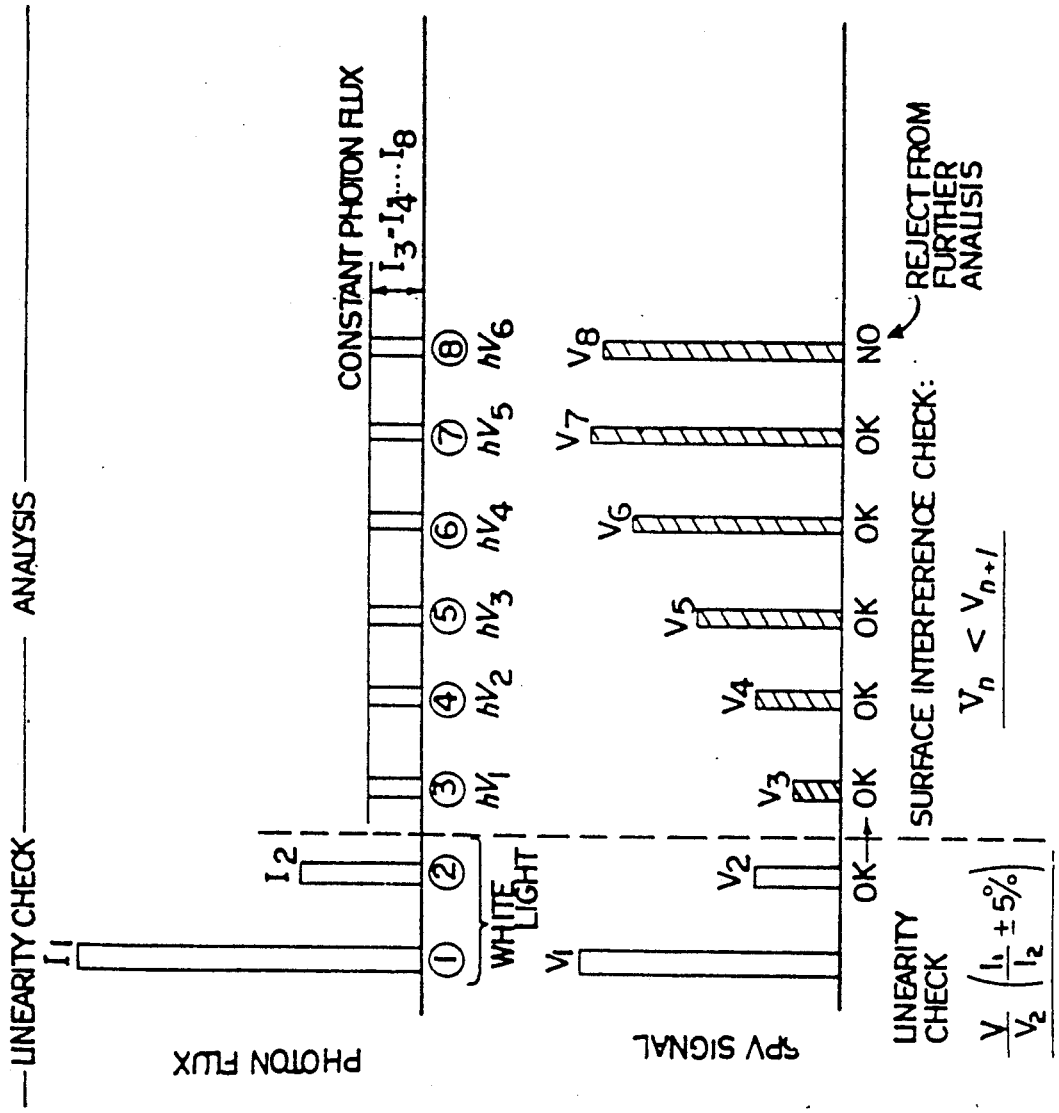
FIG. 4 is a schematic of the procedure of the method of invention.

Referring now to FIG. 4, a preferred procedure of the method of the invention will be described in more detail. Prior to the photovoltage measurement for determination of diffusion length L, white light at two different photon fluxes $\phi_1$, and $\phi_2$ is impinged upon the sample surface and photovoltages $V_1$ and $V_2$ are measured. If the ratio of $V_1/V_2$ is substantially equal to the ratio $\phi_1/\phi_2$ (within, for example, 5%), the relationship between photovoltage and photon flux $\phi$ is considered to be in the linear region indicated on FIG. 1b. If the immediately above mentioned equality is not valid, then the incident white light beam may be attenuated and the measurement repeated. The benefit of using white light for the linearity measurement is that all the analytical wavelengths to be used in the determination of L are contained within the beam. Therefore, effects on linearity which may be particular to a given wavelength are effectively accounted for.

If the intensity is within the linear range, then the wafer is successively illuminated with light of several photon energies $h\nu_3 \ldots h\nu_8$, with energy increasing i.e., $h\nu_3 < h\nu_4 < h\nu_5 < h\nu_6 < h\nu_7 < h\nu_8$ and with the effective photon flux of each being the same constant. The photon flux value selected is lower than the lower white light test flux $\phi_2$ to assure the photovoltages $V_3$-$V_8$ are in linear range. Before calculation of the diffusion length, the photovoltages are analyzed to assure that each measured voltage is greater than the previously measured. In the event that this relation does not hold as for example for $V_8$ in FIG. 1a and FIG. 4 which could be caused by surface effects, these voltages are excepted from calculation of diffusion length, L.

Referring now to FIG. 5, a preferred embodiment for an apparatus for the minority carrier diffusion length measurement of a silicon wafer according to the present invention is shown to comprise an optical source 10 for producing radiation to be impinged upon a wafer 11 held at a measuring station 12, an electronic system 14 which includes a lock-in amplifier 48 to measure individual photovoltages, and a data processing station 16 for the purpose of carrying out various computations including the calculation of minority carrier diffusion length and the semiconductor contamination factor, and optionally for controlling the measuring system.

The optical system 10 preferably employs a quartz halogen bulb 18 held in a source housing 20. Radiation produced by the bulb is focused and passed first through a rotating chopper 22, held within the source housing 20 and operated of a selected frequency in the range between 5-100 HZ. Following the chopper is the light intensity attenuator, an iris diaphram 26 and a graduated variable neutral density filter 28, held in an assembly 23. The attenuator is adjustable for increasing or decreasing light intensity in the linearity measurement procedure to be described below After passing through the filters, the attenuated beam is focused onto a first glass fiber optical cable 30 which is coupled to the filter assembly 23 by means of well known cable mounts. The cable 30 brings radiation from the source, modulated by the chopper to a filter wheel 36 which may be used for wavelength selection. Each filter in the filter wheel consists of a narrow band pass filter and a customized set of neutral density filters, the former assuring the monochromatic light and the latter being used to achieve a constant photon flux $\phi_{eff}$=const.

After passage through a filter of the filter wheel 36, the beam which may be substantially monochromatic in the case of a photovoltage measurement for determining minority carrier diffusion length is coupled to a fiber optical cable 38 which directs the radiation toward the measuring stage 12. The use of the fiber optical cables in this preferred embodiment provides a particular advantage of the apparatus in that the system need not be entirely shaded from ambient light which might otherwise cause measurement errors or increased noise in conventional open optic designs.

At the stage 12, the light incident upon the wafer 11 generates a photovoltage which is detected by the probe 67 and coupled to a lock in amplifier 48 in the electronic system 14 via link 50. The electronic system further includes a control for the light source chopper which provides a reference signal for the lock-in 48 via link 58.

Continuing to refer to FIG. 5, the front view of the filter wheel 36 is provided and shown to include eight filters labeled 1-8 which may be selectively positioned in the radiation path of the optical cable 30, by turning the knob 62. Two filters for use in the linearity check, for example, 1 and 2 transmit white light and have an intensity ratio of $I_1/I_2 = 2.00 \pm 0.05$. Filters 3-8 are composed of the narrow band (half width, e.g., $\leq 0.01$ ev) pass interference filters that transmit monochromatic radiation and the customized neutral density filters which assure a similar photon flux within $\pm 2\%$ for use in minority carrier diffusion length measurements. An example of a set of filter characteristics for the measurement of diffusion length L in silicon wafers are given in Table I below:

TABLE I

| Wheel Position | Photon Energy | Output Effective Photon Flux (arb. units) |
| --- | --- | --- |
| 3 | 1.210 | 1.00 |
| 4 | 1.240 | 0.98 |
| 5 | 1.269 | 1.02 |
| 6 | 1.303 | 1.00 |
| 7 | 1.340 | 0.99 |
| 8 | 1.380 | 1.01 |

The measuring station 12 provides rotary motion ( ) in the wafer plane by means of, for example, a rotary positioner which supports the wafer 11. The wafer 11 itself is mounted on an electrically grounded aluminum base 88. The rotary positioner 64 is in turn supported on stage which allows linear motion in the wafer plane in the direction of the arrow X. The stage further includes a probe 66 which accepts the optical cable 38 for directing the radiation to the wafer surface and detects the induced photovoltage. The probe may be supported on a vertical positioner which allows raising and lowering the probe in the Z direction as indicated by the arrow.

The preferred procedure in the apparatus described above for measurement of minority carrier diffusion length includes confirming the linearity of the photovoltage as a function of the light intensity and then measuring the photovoltage for the six different photon energies with the effective photon flux of the radiation from each being constant and in the linear range. Finally, calculation of the minority carrier lifetime, diffusion length and/or contamination factor may be made using the preceding measurement of photovoltage at the various wavelengths, by plotting the photovoltage as a function of the reciprocal absorption coefficient at the given wavelengths and extrapolating the plot to the X axis as described earlier with respect to FIG. 1a.

A wafer, properly treated (e.g. by removal of an oxide layer in BHF for P-type wafers or for N-type wafer in addition, submerging for 1 to 2 minutes in $K_2 Mn O_3$ or boiling in deionized water for 15–45 minutes to stabilize the surface barrier height) is placed on the stage support and the probe 66 lowered such that of the probe electrode is flush upon the wafer. The filter wheel 36 should be adjusted to position 1, the first filter for linearity check. After adjusting the lock-in 48 to be in phase with the chopped signal, the attenuator is adjusted to reduce the magnitude of the photovoltage. The photovoltage reading $V_1$ corresponding to position 1 is noted and the filter wheel moved to position 2 and the photovoltage $V_2$ measured and recorded. The intensity ratio of the white light transmitted by these filters is, as mentioned $I_1/I_2 = 2.00 \pm 0.05$. Photovoltages $V_1$ and $V_2$ are then introduced to the computer 16 and the linearity test is passed if:

$$1.95 \lesssim V_1/V_2 \lesssim 2.05$$

If the voltage ratio is not within this range, the attenuator may be further adjusted to decrease the intensity of the incident radiation and the values of $V_1$ and $V_2$ remeasured.

For photovoltage measurements to determine the diffusion length, the filter wheel is successively moved to positions 3 to 8 and the resulting photovoltage values are measured and recorded.

For calculation of the carrier diffusion length L in this embodiment, this procedure may use 2, 3, 4, 5, or 6 data points depending on the following conditions:
If $$V_3 < V_4 < V_5 < V_6 < V_7 < V_8$$

then all 6 points are used for data processing. However, if $V_8$ is affected by surface effects then:

$$V_3 < V_4 < V_5 < V_6 < V_7 > V_8$$

and the system rejects $V_8$ and uses 5 points for data processing. If $V_7$ and $V_8$ are both affected by surface recombination effects then:

$$V_3 < V_4 < V_5 < V_6 > V_7 > V_8,$$

and the system rejects $V_7$ and $V_8$ and uses the remaining 4 points for data processing It should be evident to those skilled in the art that this is but one preferred embodiment for rejection of photovoltage data affected by surface effects. Other more sophisticated algorithms could be implemented without departing from the scope of the present invention.

Using the valid points, voltages according to the above criterion, a least squares fit of reciprocal photovoltage reciprocal $1/V$ as a function of the inverse of the absorption coefficient is performed and the intercept determined and reported as the diffusion length.

The minority carrier lifetimes ($\tau$) may also be calculated for holes in N-type silicon and electrons in P-type silicon using expression (1) and known values of the electron and hole mobilities $\mu_n$ and $\mu_p$, respectively. Approximate expressions corresponding to room temperature measurements are:

$$\text{for electrons } \tau_n = 0.5 \times L^2 \times 10^{-3} \, \mu s$$

$$\text{for holes } \tau_p = 1 \times L^2 \times 10^{-3} \, \mu s$$

where L is in micrometers

The contamination factor (F) provides a measure of the relative increase of the concentration of recombination centers (contaminants) with respect to a reference wafer. For calculation of the contamination factor, a value for $L_{ref}$ in clean (not contaminated) wafer may be used. The contamination factor F is then given by:

$$F = (L_{ref}/L)^2 - 1$$

Another aspect of the invention provides a probe which permits the measurements of SPV to be made with the bulk of the sample exposed to ambient light by shading of only that region of the semiconductor sample upon which the beam is incident.

Referring now to FIGS. 6a and 6b a detailed cutaway view of the probe positioned just above the wafer surface and upon the wafer surface as it would be during a photovoltage measurement are shown, respectively. The probe body is constructed from a material such as a dark plastic which is not transparent to light and comprises a first aperture 68 for receiving the fiber optic cable which may be attached sealably or via common couplers and a second aperture 70 disposed opposite the first aperture for vertical direction of the provided radiation. The second aperture 70 defines the photovoltage probing spot on the wafer and the probing area $\Delta S$ is approximately equal to the cross-sectional area of this aperture. Preferably, between the first and second apertures and beyond the point at which the fiber optic cable terminates in the probe body, a lens 90 is provided for forming uniform beam of radiation through the second aperture 70. About the second aperture, a base region 72 is provided which is of substantially greater outside diameter than the aperture 70, for example, the outer diameter of the base 72 is preferably about 25 mm, $T_1$, while the diameter of the aperture 70 is about 2 mm, $T_2$.

The probe is further provided with a semi-transparent, flexible foil photovoltage pickup electrode 74 formed from a transparent plastic film positioned across the second aperture 70 with a conducting surface of, for example, a layer of indium-tin oxide that faces the wafer as shown in greater detail in FIG. 6c. An alternative to the indium-tin oxide coating, a thin metal transparent film could be used with a dielectric spacer facing the wafer as is known in the art.

The electrode is anchored to the base 72 at anchoring region 76 at a first end and slidably fit into a clear slot 78 in the base at a second end. The electrode is flexibly tensioned by its configuration about the base such that it extends beyond the base itself when the probe is not in contact with the wafer as shown in FIG. 6a. The probe base further provides a cutout region 80 about the second aperture where the electrode extends therefrom. The conducting indium tin oxide, layer on the electrode is connected to the lock in (via link 50 in FIG. 5) which is connected near the anchoring region 76.

Before photovoltage measurements, the probe 66 is lowered to the wafer surface by means of adjustment of a vertical positioner. Upon coming in contact with the surface, electrode 74 slides into slot 78 until the base surface 84 is flush upon the wafer and the electrode 74 is contained within the cutout region 80 as shown in FIG. 4b.

During photovoltage measurement, the modulated radiation is directed through the electrode to the wafer surface where a photovoltage is induced and measured by the electrode. Because the width of the base 84 is flush against the wafer surface which is much larger than the wafer area imaged by the beam and measured by the pickup electrode, stray background light is blocked from the surface area interrogated, thereby reducing noise levels in the measurement. This design represents a significant improvement over previous surface photovoltage probes by permitting its use in the presence of ambient light and thereby avoiding the inconvenience of shading the entire wafer.

Preferably, the probe described with reference to FIG. 6a-6c is employed in the apparatus discussed with reference to FIG. 5. Since the probe effectively blocks ambient radiation from that portion of the wafer being interrogated by the beam and the apparatus of FIG. 5 employs fiber optics for transport of the beam, the measurements are made convenient by allowing operation in ambient light while maintaining low noise level and providing an accurate determination of the diffusion length.

Several modifications and variations of the present invention are possible when considered in the light of the above teachings. It is therefore understood that the scope of the present invention is not to be limited to the details disclosed herein, but may be practiced otherwise than as specifically described, and is intended only to be limited by the claims appended hereto:

What is claimed is:

1. A method for determining the minority carrier diffusion length of a sample of a semiconductor material comprising the steps of:
   selecting a photon flux for determining said minority carrier diffusion length by illuminating a surface of said semiconductor with beams of radiation having at least two different photon flux values to induce photovoltages, detecting and analyzing said photovoltages as a function of photon flux and; selecting a photon flux based on said analysis;
   determining said minority carrier diffusion length by illuminating a surface of said semiconductor successively with beams of monochromatic radiation having different photon energies to induce surface photovoltages;
   said radiation at said different photon energies having a photon flux being substantially equal to said selected photon flux;
   detecting said photovoltages and;
   analyzing said photovoltages as a function of the absorption coefficients of said photon energies for said semiconductor to deduce said minority carrier diffusion length.

2. The method of claim 1 further comprising the step of selecting said photon flux from a range in which said photovoltage is a linear function of photon flux.

3. The method of claim 1 wherein said selecting further comprises the step of impinging a white light beam upon said semiconductor, for at least two different levels of photon flux,
   detecting photovoltages induced by said white light beam at said two levels, and
   comparing said voltages to said two fluxes.

4. The method of claim 3 wherein said comparing includes comparing at least one ratio of said voltages to at least one ratio of said fluxes.

5. The method of claim 4 wherein said photon flux is selected when at least one said ratio of said voltages are substantially equal to said ratio of said fluxes.

6. The method of any one of claims 1-5 wherein said determining said minority carrier diffusion length further comprises the steps of analyzing said photovoltages as a function of said photon energies and excluding said photovoltages which do not fall on a monotonically increasing plot of photovoltage versus said photon energy of said wavelengths.

7. The method of claim 6 wherein said analyzing of said photovoltages includes comparing a first said photovoltage to a second said photovoltage,
   said first photovoltage being induced by a lower photon energy than said second photovoltage and
   excluding said second photovoltage if said second photovoltage is less than said first photovoltage.

8. The method of claim 7 wherein said second photovoltage is excluded if said first and second photovoltages are substantially equal.

9. An apparatus for determining the minority carrier diffusion length of a sample of a semiconductor material, comprising:
   illuminating means for illuminating at least a portion of a surface of said semiconductor with radiation to induce photovoltages;
   detecting means for detecting said photovoltages; and
   analyzing means for analyzing said photovoltages;
   said apparatus being adapted to enable selection of a photon flux for determining said minority carrier diffusion length, wherein said illuminating means is adapted to illuminate said surface of said semiconductor with beams of radiation having at least two different photon flux values to induce photovoltages, and
   said analyzing means is adapted to analyze said photovoltages as a function of said photon flux and enable selection of said photon flux based on said analysis;
   said apparatus being further adapted to determine said minority carrier diffusion length, wherein said illuminating means is further adapted to successively illuminate said surface of said semiconductor with beams of monochromatic radiation having different photon energies to induce surface photovoltages;

said illuminating means being capable of providing said radiation at said different photon energies at said selected photon flux;

and said analyzing means being further adapted to analyze said photovoltages as a function of the absorption coefficients of said different photon energies for said semiconductor to deduce said minority carrier diffusion lengths.

10. The apparatus of claim 9 wherein said illuminating means includes fiber optic cables for directing said radiation to said semiconductor material.

11. The apparatus of claim 9 wherein said photon flux is selected from a range in which said photovoltage is a linear function of said photon flux.

12. The apparatus of claim 10 wherein said illuminating means is arranged to impinge a white light beam upon said semiconductor for at least two levels of photon flux, said detecting means is arranged to detect said photovoltages induced by said white light beam at said levels and said analyzing means is arranged to compare said voltages to said fluxes.

13. The apparatus of claim 12 wherein said comparing includes comparing at least one ratio of said voltages to at least one ratio of said fluxes.

14. The apparatus of claim 13 wherein said photon flux is selected if said ratio of said voltages are substantially equal to said ratio of said fluxes.

15. The apparatus of claim 9 or 11 wherein said detecting means comprises:

a housing formed from material nontransparent to radiation, said housing including a first side distal from said substrate with an aperture for accepting light from a source;

a second side proximal to said semiconductor surface with a second aperture for directing said light to said semiconductor surface;

said second side including a proximal end having a flexible, transparent electrode disposed across said second aperture and a hollowed region about said second aperture to accept said flexible electrode such that said electrode is flush with said proximal end when said proximal end is positioned upon said substrate to measure said photovoltages;

said proximal end further being of substantially larger outer diameter than said second aperture for effectively blocking ambient radiation from that area of the substrate exposed to said radiation from said second aperture.

16. The apparatus of claim 15 wherein said flexible electrode comprises a first layer of a plastic film and a second layer of a conducting material, said second layer coming in contact with said semiconductor during said photovoltage measurement.

17. The apparatus of claim 9 further comprising means for measuring said minority carrier diffusion length at a plurality of positions upon said surface of said semiconductor sample to map said diffusion length of said sample.

18. A device for measuring photovoltages at a semiconductor sample surface comprising:

a first side distal from said sample with an aperture for accepting light from a desired source;

a second side proximal to said sample surface with a second aperture for directing said light to said semiconductor surface;

said second side including a proximal end having a flexible, transparent electrode disposed across said second aperture and a hollowed region about said second aperture to accept said flexible electrode such that said electrode is flush with said proximal end when said proximal end is positioned upon said sample to measure said photovoltages;

said proximal end further being of substantially larger outer diameter than said second aperture for effectively blocking ambient radiation from that area of the substrate exposed to said radiation from said second aperture.

19. The apparatus of claim 18 wherein said flexible electrode comprises a first layer of a plastic film and a second layer of a conducting material, said second layer coming in contact with said semiconductor during said photovoltage measurement.

20. A method for determining the minority carrier diffusion length of a sample of a semiconductor material comprising the steps of:

illuminating a surface of said semiconductor successively with beams of monochromatic radiation having different photon energies to induce surface photovoltages;

said radiation at said different photon energies being of substantially equal photon flux;

detecting said photovoltages;

analyzing said photovoltages as a function of said photon energies and excluding said photovoltages which do not fall on a monotonically increasing plot of photovoltage versus said photon energy, and;

analyzing said monotonically increasing photovoltages as a function of the absorption coefficients of said photon energies for said semiconductor to deduce said minority carrier diffusion length.

21. The method of claim 1 or 20 further comprising the step of measuring said minority carrier diffusion length at a plurality of positions upon said surface of said semiconductor sample to map said diffusion length of said sample.

22. The method of claim 1 or 20 further comprising the steps of measuring induced photovoltages for a semiconductor sample of known short diffusion length, analyzing said photovoltages as a function of the absorption coefficients corresponding to said photon energies for said semiconductors sample of known diffusion length, and determining the validity of said minority carrier diffusion length measurements from said analysis.

23. The method of claim 22 wherein said determining includes, excluding said coefficients which do not produce a substantially linear plot of said photovoltage versus said absorption coefficients.

24. The method of claim 22 or 23 wherein said determining includes, rejecting said photon flux if said photovoltages are not a linear function of said absorption coefficient.

* * * * *

UNITED STATES PATENT AND TRADEMARK OFFICE
CERTIFICATE OF CORRECTION

PATENT NO.  : 5,025,145
DATED       : June 18, 1991
INVENTOR(S) : Jacek J. Lagowski It is certified that error appears in the above-identified patent and that said Letters Patent is hereby corrected as shown below:

Col. 2, Choo and Sanderson, "Corner" should be --Carrier--.

Col. 2, Chu and Stokes, "Corner" should be --Carrier--.

Col. 1, line 20, "meansure" should be --measure--.

Col. 1, line 48, "the is" should be --is the--.

Col. 1, line 64, insert --.-- after "(SPV)".

Col. 6, line 38, "($1ta^{-1}L^{-1}$), should be --($1 + a^{-1}L^{-1}$)--.

Col. 8, line 11, insert --.-- after "below".

Col. 8, line 67, "()" should be --($\psi$)--.

Col. 14, line 57, insert --absorption-- after "said".

Signed and Sealed this

Tenth Day of November, 1992

Attest:

DOUGLAS B. COMER

*Attesting Officer*    Acting Commissioner of Patents and Trademarks